(12) United States Patent
Tal et al.

(10) Patent No.: US 12,217,904 B2
(45) Date of Patent: *Feb. 4, 2025

(54) TRANSFORMER APPARATUS

(71) Applicant: Solaredge Technologies Ltd., Herzeliya (IL)

(72) Inventors: Nikolay Tal, Karmiel (IL); Tzachi Glovinsky, Petah Tikva (IL)

(73) Assignee: Solaredge Technologies Ltd., Herzeliya (IL)

(*) Notice: Subject to any disclaimer, the term of this patent is extended or adjusted under 35 U.S.C. 154(b) by 0 days.

This patent is subject to a terminal disclaimer.

(21) Appl. No.: 18/469,624

(22) Filed: Sep. 19, 2023

(65) Prior Publication Data

US 2024/0062952 A1   Feb. 22, 2024

Related U.S. Application Data

(63) Continuation of application No. 17/465,987, filed on Sep. 3, 2021, now Pat. No. 11,798,733.

(60) Provisional application No. 63/074,139, filed on Sep. 3, 2020.

(51) Int. Cl.
| | |
|---|---|
| *H01F 27/32* | (2006.01) |
| *G01R 29/20* | (2006.01) |
| *G01R 31/62* | (2020.01) |
| *H01F 27/36* | (2006.01) |

(52) U.S. Cl.
CPC ......... *H01F 27/323* (2013.01); *G01R 29/20* (2013.01); *G01R 31/62* (2020.01); *H01F 27/36* (2013.01)

(58) Field of Classification Search
CPC ......... G01R 29/20; G01R 31/62; H01F 27/32; H01F 27/36; H01F 27/323; H01F 27/324; H01F 2027/329; H01F 27/2885
USPC ...................................................... 324/726
See application file for complete search history.

(56) References Cited

U.S. PATENT DOCUMENTS

| | | | |
|---|---|---|---|
| 3,265,998 | A | 8/1966 | Park |
| 5,671,128 | A | 9/1997 | Nakamura et al. |
| 2005/0099258 | A1 | 5/2005 | Fromm et al. |

FOREIGN PATENT DOCUMENTS

| | | |
|---|---|---|
| DE | 102018213661 A1 | 2/2020 |
| EP | 0516078 A2 | 12/1992 |
| EP | 2833378 A1 | 2/2015 |
| EP | 3770931 A1 | 1/2021 |
| JP | S5031250 B1 | 10/1975 |
| WO | 2012000985 A1 | 1/2012 |

OTHER PUBLICATIONS

Feb. 7, 2022—Extended EP Search Report—EP App No. 21194496.2.
Oct. 20, 2023—EP Examination Report—EP App. No. 21194496.2.

*Primary Examiner* — Alexander Satanovsky
*Assistant Examiner* — Courtney G McDonnough
(74) *Attorney, Agent, or Firm* — Banner & Witcoff, Ltd.

(57) ABSTRACT

Systems, apparatuses, and methods are described for a transformer supporting two or more sets of windings electrically connected to different voltage levels. Use of stress control materials or composite materials (comprising a matrix and filler) may direct electrical fields caused by the different voltage levels to have a lowered electrical field amplitude.

20 Claims, 3 Drawing Sheets

TRANSFORMER APPARATUS

CROSS-REFERENCE TO RELATED APPLICATIONS

The present application is a continuation of U.S. application Ser. No. 17/465,987, filed Sep. 3, 2021, which claims priority to U.S. Provisional Patent Application No. 63/074,139, filed Sep. 3, 2020, the entirety of which are both incorporated herein by reference.

BACKGROUND

A transformer is an electronic device that includes a core and at least two sets of windings of an electrical conductor, sometimes referred to as primary and secondary sets of windings. The core comprises a magnetic material with high magnetic permeability, such as a ferromagnetic metal such as iron, or ferrimagnetic compounds such as ferrites. The high magnetic permeability of the core material, relative to the surrounding air, causes the magnetic field lines to be concentrated in the core material. The core may be shaped to enclose at least some of the magnetic field by forming a substantially closed loop of the core material, typically comprising two or more legs around with the windings are wound. The sets of windings both comprise conducting wires that are wound around At least one core leg. The primary winding may control the magnetic fields within the core and the secondary winding may convert the electrical field within the core to a voltage, possibly different from the voltage across the primary winding. The transformer may provide galvanic isolation and voltage conversion between the first and second sets of windings. When the number of windings in the first set of windings are different from the number of windings in the second set of windings, the transformer provides voltage conversion.

SUMMARY

The following summary presents a simplified summary of certain features. The summary is not an extensive overview and is not intended to identify key or critical elements.

Systems, apparatuses, and methods are described for a transformer. The transform may comprise at least two sets of windings and a magnetic core. At least one of the two sets of windings may be at a substantially higher voltage relative to the surrounding components. The edges of the high-voltage windings may be surrounded by a stress control region. The stress control region may be a region of stress control materials, such as a stress control material with a high dielectric constant, a composite stress control material with capacitive or resistive structures incorporated therein, or combinations thereof. A semiconducting layer may be located near the high-voltage windings. The stress control region may surround the edges of the semiconducting layer. The electrical field stress control region may surround the components of the transformer that are at a different voltage than the surrounding structures, such as at a voltage difference of above about 100 volts.

These and other features and advantages are described in greater detail below.

BRIEF DESCRIPTION OF THE DRAWINGS

Some features are shown by way of example, and not by limitation, in the accompanying drawings. In the drawings, like numerals reference similar elements.

DETAILED DESCRIPTION

Figure 1A:
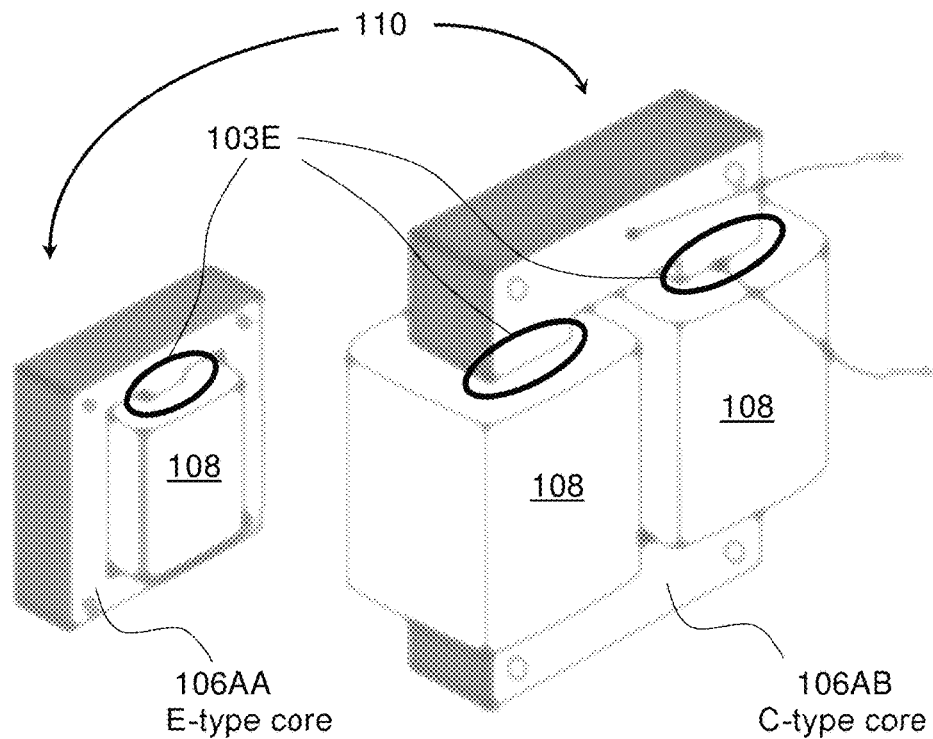
FIG. 1A shows examples of transformers in accordance with the disclosure herein.

The accompanying drawings, which form a part hereof, show examples of the disclosure. It is to be understood that the examples shown in the drawings and/or discussed herein are non-exclusive and that there are other examples of how the disclosure may be practiced. It is also noted that like references in the various figures may refer to like elements throughout the application. Similar reference numbers may also connote similarities between elements. For example, it is to be understood that transformer 110B shown in FIG. 1B may be similar to, or the same as, other transformers described and shown herein, and vice versa. Throughout the application certain general references may be used to refer to any of the specific related elements. For example, transformer 110 may refer to any of the various transformers, core 106 may refer to any of the various cores, electrical field stress control regions 103 may refer to any of the various electrical field stress control, etc. The term "windings" may refer to a set of windings each comprising one or more turns of a conductor surrounding a leg of a transformer core.

Reference is now made to FIG. 1A, which shows example transformers 110 in accordance with the disclosure herein. Transformers 110 comprise cores 106AA and 106AB and multiple sets of windings (which may be inside a housing 108 depicted in FIG. 1A). Windings and internal transformer layers may comprise edges (e.g., an edge where the windings terminate), such as ends of the windings, sharp corners, edges of semiconducting layers, and the like. The edges may produce a high electrical field when a component operating at a different voltage (relative to the edge) is nearby. When the voltage difference between any two components of the transformer is high, such as a voltage difference above about 100 volts (V), discharges or arcs may be caused by the resulting high electrical field (e.g., electric stress). Transformers 110 described herein may have one or more electrical field stress control regions 103E surrounding the edges of the components that have voltage differences (also referred to as regions 103E for brevity). These regions 103E may encircle the transformer windings or layers, but regions 103E are shown as specific examples on the near side of the visible regions of each transformer. The electrical field stress control regions 103E may limit the electrical field strength created around the edges of the components. The electrical field stress control regions 103E may comprise a high dielectric constant material. For example, the regions 103E may comprise a material with a high dielectric constant disposed around the edges that controls the electrical field strength (and resulting electrical stress) around the edges. For example, the regions 103E may comprise embedded particles of other materials. For example, the regions 103E may comprise electronic components or micro-components (such as particles that affect the electrical impedance surrounding the particles).

Figure 1B:
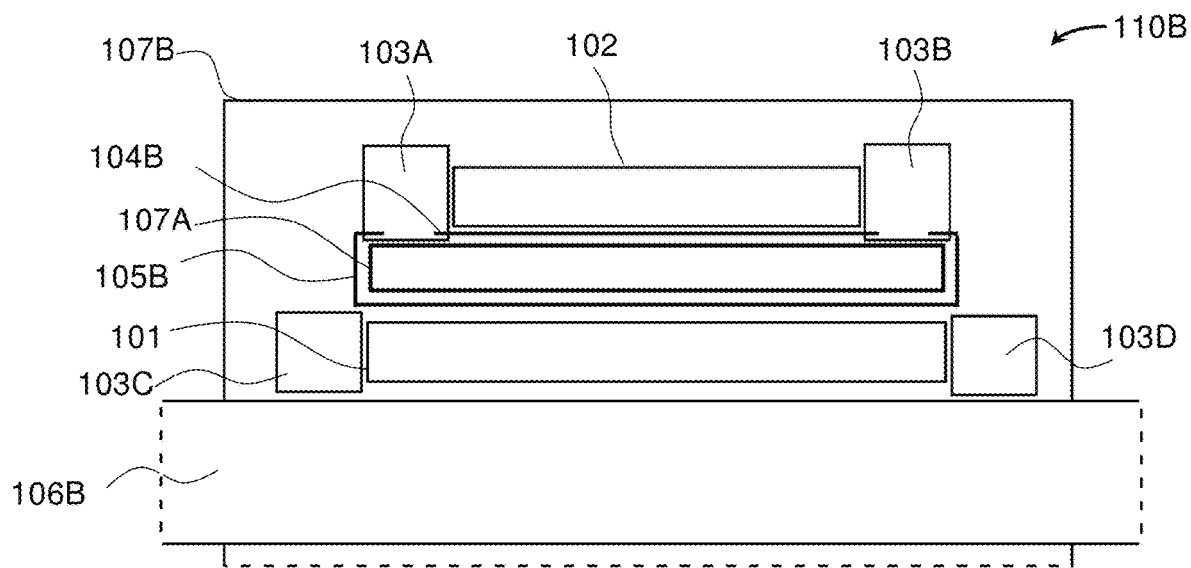
FIG. 1B shows an example model of a transformer in accordance with the disclosure herein.

The cores 106AA and 106AB of FIG. 1A or the core 106B of FIG. 1B may comprise two or more legs, and the windings may encircle one or more of these legs. For example, core 106AA may comprise three legs (E-type core of FIG. 1A), and the windings may encircle the middle leg. For example, core 106AB may comprise two legs (C-type core of FIG. 1A), and windings may encircle both legs. For example, a core 106 may comprise two legs and one or more windings may encircle each leg. The regions 103E shown are some examples configured according to the internal structures of the windings and layers. Other configurations of number of legs and windings may be implemented with aspects of this disclosure.

Reference is now made to FIG. 1B, which shows a model of a transformer 110B in accordance with the disclosure herein. For brevity, only half-windings are shown, but it is understood that there may be full windings surrounding the one or more legs of the core 106B. For example, the windings structure (typically wound on a bobbin structure) may symmetrically surround a leg of the core 106B, with similar cross sections around the annular edge of the windings or internal layer. The transformer 110B may comprise multiple windings (e.g., a first set of windings, also referred to as first windings 101, and a second set of windings, also referred to as second windings 102) and a core 106B. FIG. 1B may depict, in a cross sectional schematic, a cross sectional component, which may be paired with another component (e.g., another half) as indicated by the dashed line on the bottom. To reduce the failure rate of the transformer, regions 103 (also referred to as regions 103 for brevity) that control electrical field stress may be created around edges of the windings. To reduce the failure rate of the transformer, the electrical field stress control regions 103 may be created around edges of the semiconducting layers 104B, 105B. Regions 103 may comprise an electrical field stress control material or a composite material. For example, materials with a high dielectric constant (high-k material) may be placed where the electric field is high, such as for example to completely or partially surround (e.g., encapsulate at least in part or enclose at least in part) the edges of the second windings 102. For example, a composite material comprising a non-linear resistive material (such as zinc-oxide particles for example) in an elastomer matrix may be used to stress control the electrical field in the regions 103 of high electrical field surrounding the edges. For example, capacitive elements may be embedded in the regions adjacent to the edges. For example, capacitive elements may be embedded in regions between the edges and low voltage components. For example, the embedded capacitive elements may produce a non-linear capacitive effect using a gradient of materials or additives/components, such as a gradient of ZnO particle concentrations where higher concentrations are at locations of higher electrical field stress (in the absence of stress control regions, such as near the second windings 102 or semiconducting layer 105B) and lower concentrations at locations of lower electrical field stress (such as near the first windings 101 or semiconducting layer 104B).

A first pair of stress control regions 103A and 103B may be disposed around edges or other portions of the second windings 102 that may cause high electrical field concentrations. The regions 103A and 103B may form an annular ring adjacent to the edge of the winding that surrounds the core 106. High electrical field stress above a breakdown voltage threshold in the regions 103A and 103B may cause damage from resulting surface arcs. Disposing regions 103A and 103B adjacent to the ends of the second windings 102 may reduce surface arcs in the transformer 110B, such as when a high voltage is generated in the second windings 102. Disposing a second pair of stress control regions 103C, 103D around the ends of the first windings 101 may reduce surface arcs in the transformer 110B, such as when a high voltage is generated on the first windings 101. For example, the voltage difference between the inner windings 101 or inner semiconducting layer 104 and the core material may be greater than 100V and the resulting electrical field stress may cause breakdown of the insulating layers therebetween. An inner insulation layer 107A may be used between windings 101 and 102, which may have the advantage of preventing an electrical connection between the windings 101 and 102. An outer insulating layer 107B may surround the windings 101 and 102, semiconducting layers 104 and 105, and regions 103. A first semiconducting layer 104B may be adjacent to second windings 102, and may have a substantially similar electrical voltage as the second windings 102 (such as a mid-voltage electrical voltage of up to 69 kilo-volts [kV]). For example, a second semiconducting layer 105B may be adjacent to first windings 101, and may have a substantially similar electrical voltage as the first windings 101 (such as an electrical voltage varying between zero and 100 volts (V) along the length of the first windings 101). Second semiconducting layer 105B may comprise edges adjacent to the first semiconducting layer 104B, and regions 103A and 103B may be disposed between these edges. Semiconducting layers 104 and 105 may be used to shield the windings 101 and 102 from other electrical fields. For example, semiconducting layers 104 and 105 may have the advantage of evenly distributing charge over the surface of the semiconducting layer 104 and 105, which may prevent a buildup of electrical charge.

As may be illustrated in FIG. 1B, core 106B may be of a rectangular shape, such as by having two legs and two shorter members connecting parallel legs to form a full magnetic path. Other arrangements (e.g., square shapes with more or fewer legs, round shapes, etc.) are possible. As an example, core 106B may comprise two half shapes, and may comprise an air gap (e.g., less than about 5 millimeters) for preventing eddy currents from forming in the core.

The electrical field stress control regions 103 (such as regions 103A, 103B, 103C, 103D from FIG. 1B as with regions 103E from FIG. 1A) may comprise capacitive material or particles, non-linear resistive materials with a high relative permittivity, or materials with a high dielectric constant (also referred to as materials with high-k). For example, a material with a relative permittivity greater than or equal to about 10 may be suitable for stress control regions in a transformer.

The materials used for the semiconducting, or partially-conducting, layers 104 and 105 may be based on a material comprising a volume resistivity between that of a conductor and an insulator. For example, a suitable range of volume resistivity may be between about 0.001 ohm/meter and about 10 kilo-ohm/meter. The semiconducting layers 104 and 105 may be measured using a semiconducting sheet resistivity. For example, a suitable range of sheet resistivity may be between about 0.01 ohm/square and about 10 mega-ohm/square. Semiconducting layers 104 and 105 may be a matrix comprised of polymers, copolymers, thermosets, thermoplastic, and/or the like. For example, the matrix may be comprised of polycarbonate (PC), polyether ether ketone (PEEK), polyamide, polypropylene (PP), polyphenylene sulfide (PPS), acrylonitrile butadiene styrene (ABS), polybutylene terephthalate (PBT), polyethylene terephthalate (PET), polyphenylene oxide (PPO), polyphenylene sulfide (PPS), polyvinyl chloride (PVC), polyamide (Nylon), silicone, epoxy, acrylic, or any other such material. The partial conductivity of a material may be intrinsic (e.g., material properties) and/or extrinsic, such as by the addition of a particular percentage conducting particles, such as carbon black or the like.

The high-k materials used for stress control regions 103 may, in some cases, be based on commercially available materials, such as electrical stress control tape.

Stress control regions 103 may comprise non-linear resistive materials, such as non-linear resistive putties or tapes. For example, nonlinear ZnO/silicone composite materials may be used for stress control regions 103. Stress grading materials may be used for stress control regions 103. For example, a semiconductor material having graded concentrations in a composite material (and may have spatial graded permittivity) may be used for stress control regions 103. For example, graded concentrations of ZnO particles in a silicon rubber matrix may be used for stress control regions 103. Composites made of microvaristor filled silicone may be used for stress control regions 103. For example, composites including zinc oxide (ZnO) may be used for stress control regions 103. For example, composites including bismuth oxide (Bi2O3) additives may be used for stress control regions 103. For example, a silicone matrix may be used for composite stress control regions 103.

Stress control regions 103 may comprise composites including particles, such as silicon carbide (SiC). Stress control regions 103 may comprise polymeric composites including resistive additives, such as carbon black. Stress control regions 103 may comprise polymeric composites including additives of blends of different oxides (e.g., BaTiO3, TiO2, SiO2, Fe3O4, mica, etc.). The additives may affect the electrical field developed between the different voltages of components of the transformer 110, depending on the application and structure of the windings. For example, additives may adjust conductivity and affect the electric field. For example, additives may adjust impedance and affect the electric field. For example, additives may be distributed in varying concentrations around the regions surrounding the edges of windings or semiconducting layers 104 and 105 to prevent electrical field stresses and resulting material breakdown from negatively effecting the performance of the transformer 110. For example, a voltage may develop from one end of a set of windings to the other during operation, so depending on the electrical design of the transformer the voltage differences between the low voltage primary windings (LV windings) and medium voltage secondary windings (MV windings) along the length of the windings may vary. For example, voltage along the MV windings (without a semiconducting layer) may vary from 0 volts one end to 44 kV at the other end, while the LV windings may vary from 0 volts at one end to 100 volts at the other end. In this example the stress control regions may be adjacent to the ends of the MV windings (between the MV windings and the LV windings) and the stress control regions may include additives at high concentrations adjacent to the MV windings where the electrical field is higher.

Reference is now made to FIG. 1B, which shows a cross-section view of the transformer of FIG. 1B. The cross-section view shows the core leg 106B at the center. The cross-section view shows the stress control region 103C adjacent to the edge of the inner windings 101 (not visible), and surrounding the core leg 106B. The cross-section view shows the semiconducting layer 105B in between the inner windings 101 and the outer windings 102, and surrounding the core leg 106B. The cross-section view shows the stress control region 103A adjacent to the edge of the outer windings 102 (not visible), and surrounding the core leg 106B.

Figure 2:
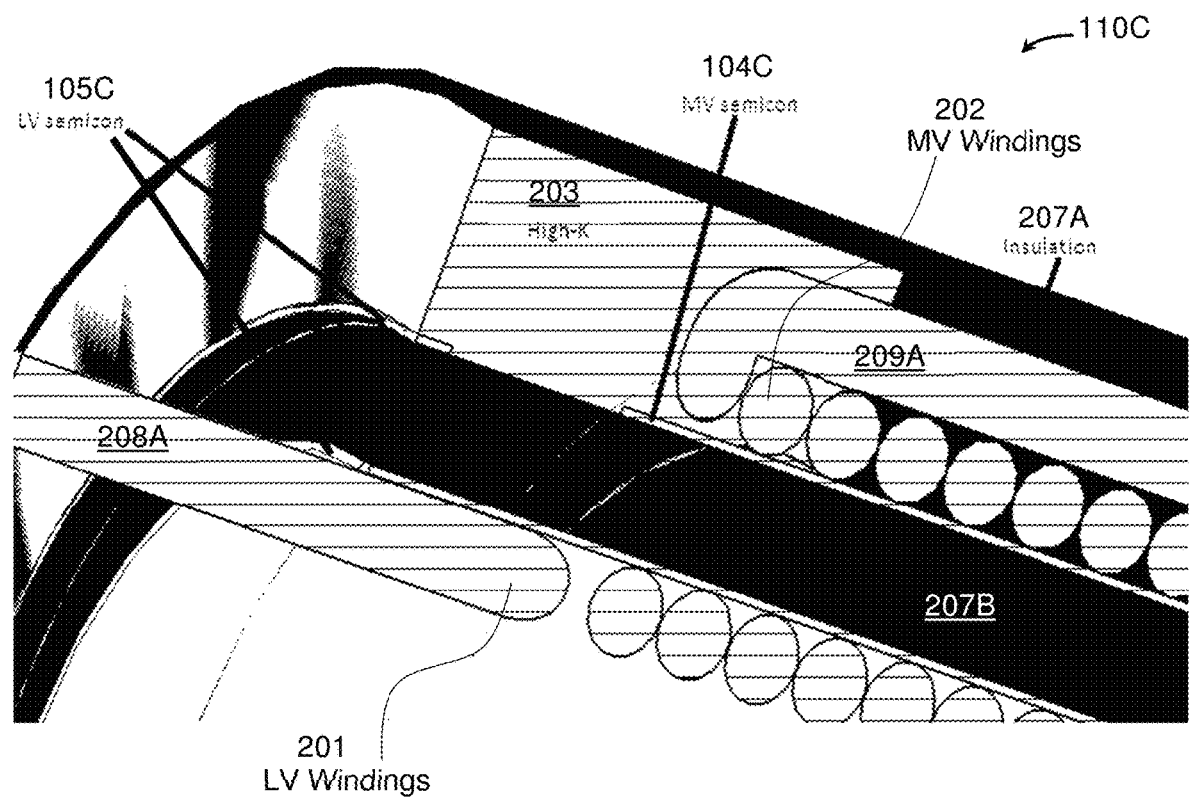
FIG. 2 shows an example rendering of additional details of a transformer in accordance with the disclosure herein.

Reference is now made to FIG. 2, which shows an example rendering of a transformer 110C in accordance with the disclosure herein. Transformer 110C may comprise LV windings 201 and MV windings 202. An insulation layer 207A covers the MV windings 202 on both sides and an inner insulation layer 207B fills the space between semiconducting layers 104C and 105C. Semiconducting layers 104 and 105, may cover the LV windings 201 and MV windings 202. First semiconducting layer 104C and second semiconducting layer 105C are also referred to herein as MV semiconducting layer 104C and LV semiconducting layer 105C, respectively. Stress control regions 203 of a high dielectric constant material (also referred to as a high-k material) may be placed between the LV semiconducting layer 105C and the MV semiconducting layer 104C. This may have the advantage of reducing the electrical field strength in this stress control region below a threshold that may cause surface arcing (e.g., arcing due to the LV semiconducting layer 105C being adjacent to the MV semiconducting layer 104C and MV windings 202). A magnetic core 106, as described above, may be adjacent to LV windings 201. Stress control regions 203 may be similar to electrical field stress control regions 103E described above, such as both configured to reduce electrical field stress and comprising high-k materials or composite materials. Insulation layer 207 may be similar to insulation layer 107 described above, such as both configured to insulate the electrical components and comprising electrically insulating materials.

Figure 1C:
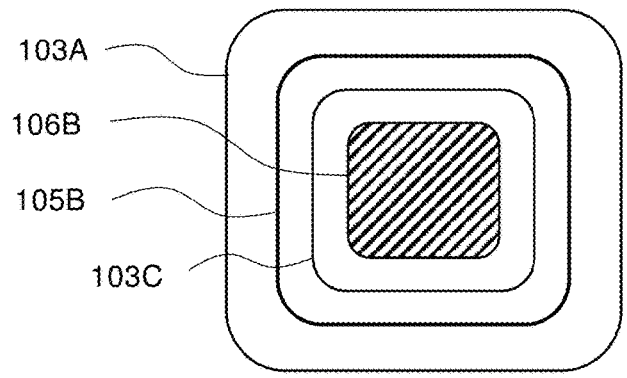
FIG. 1C shows a cross-section view of the example transformer of FIG. 1B.

In the example transformers shown in FIGS. 1A-2, windings 101, 102, 201 and 202 may have a single winding layer of conducting material. According to aspects disclosured herein, each of windings 101, 102, 201 and 202 may comprise more than one layers of windings, each winding layer comprising multiple individual turns of the conductor wound around a leg of the core (e.g., tens, hundreds, or thousands of individual turns). Windings 101, 102, 201 and 202 may be formed using single-strand wire, or multi-strand wire (such as a Litz wire).

Figure 3:
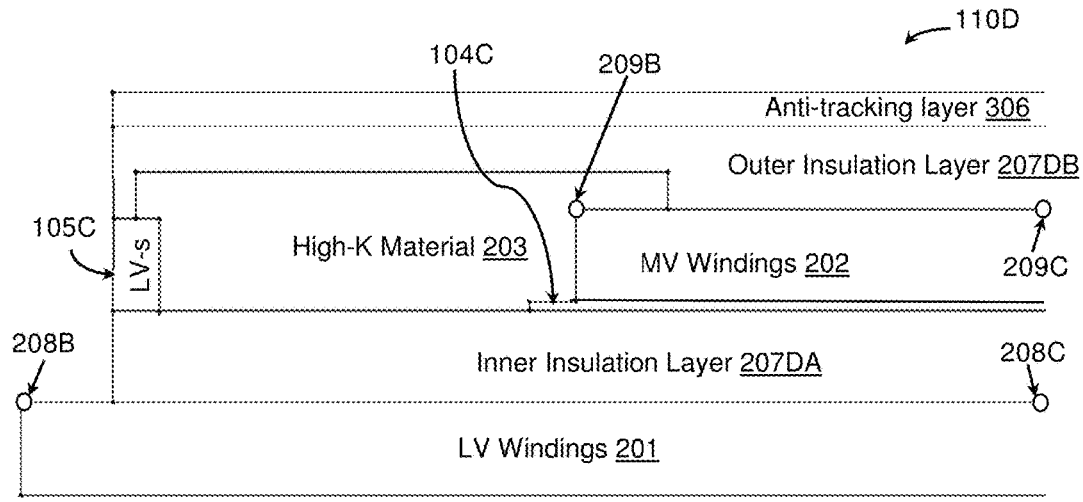
FIG. 3 shows an example model of a transformer in accordance with the disclosure herein.

Reference is now made to FIG. 3, which shows an example model transformer 110D, such as the example transformer 110C of FIG. 2, in accordance with the disclosure herein. LV windings 201 may be adjacent to a core 106, as described above, of the transformer 110C. An inner insulation layer 207DA may separate the main LV windings 201 from the MV windings 202. An LV semiconducting layer 105C may be adjacent to the inner insulation layer 207DA and may be electrically connected to LV windings 201. For example, a stress control regions 203 with high dielectric constant (high dielectric constant material also referred to as a high-k material) may be arranged between the LV semiconducting layer 105C and the MV windings 202. Stress control regions 203 may be arranged to separate a relatively low voltage of the LV semiconducting layer 105C from a relatively high voltage of MV windings 202. For example, the difference between the voltage of LV semiconducting layer 105C and the voltage of MV windings 202 may be between about 100 V to about 100 kV. An MV semiconducting layer 104CA may be arranged adjacent to the inner insulation layer 207DA and adjacent to MV windings 202. An outer insulation layer 207DB may surround the MV windings 202, stress control regions 203 and LV semiconducting layer 105C.

An anti-tracking layer 306 may be used to prevent arc tracking along the surface of the transformer 110. The anti-tracking layer 306 may comprise an insulating material that has high surface resistivity. The high surface resistivity may be especially particularly resistant to surface arc tracking in the presence of moisture, dirt, oil, or other contaminants. For example, materials with high surface resistance under tracking conditions can be identified using the methods specified in IEC standard 60112 and ASTM D3638, for example a material classified as Material Group I according to IEC standard 60112 may be used. For example, a tape or layer of material nylon 66 with a comparative tracking index of at least about 598 volts may be used as an anti-tracking layer 306.

Windings 101, 102, 201 and 202 may be wound around a bobbin, where the bobbin fits over a core 106 leg and is used to wind the winding's conductors around the bobbin before inserting the bobbin on the core leg. Windings 101, 102, 201 and 202 may feature two or more voltage terminals 208 and 209 that may be connected to voltage terminals of a power source circuit (such as a full-bridge of transistors or diodes, or any other compatible type of power electronics circuit) or a load circuit. An inner semiconducting layer 105 (which may be second semiconducting layer 105B or LV semiconducting layer 105C) may be disposed around the inner windings (such as first windings 101 or LV windings 201). For example, the inner semiconducting layer 105 may partially or completely encompass the inner windings 101 and 201. The inner semiconducting layer 105 may be electrically connected to (e.g., as a result of being manufactured together with, or later electrically connected to) inner windings 101 and 201, and may diffuse the electrical fields strengths between the windings 101 and 102 or 201 and 202. The inner semiconducting layer 105 may be connected to a voltage terminal 208A or 208B of the inner windings 101 or 201. This may result in the inner semiconducting layer 105 being electrically connected to the same electrical voltage as the first voltage terminal 208A or 208B of the inner windings 101 and 201.

Insulating material (such as inner insulation layer 107A or inner insulation layer 207DA) may be disposed (such as by injection, wrapping, heat-shrinking, or the like) between inner semiconducting layer 105 and outer semiconducting layer 104. The outer semiconducting layer 104 and inner semiconducting layers 105 may be disposed around (such as by partially or completely encompassing the inner insulating layer 107A or 207DA). The outer semiconducting layer 104 may be second semiconducting layer 104B or MV semiconducting layer 104C. The terms inner and outer as used herein mean proximal to the core leg or distal to the core leg in the axial direction (from the core leg axis).

Outer windings, which may be second windings 102 or MV windings 202, may encompass the outer semiconducting layer 104. Outer windings 102 or 202 may each feature two or more voltage terminals 209A and 209B, with a first one of the voltage terminals 209A or 209B electrically connected to the outer semiconducting layer 104. One of the two or more voltage terminals 209A or 209B may be electrically connected to the outer semiconducting layer 104 to the same electrical voltage as the first voltage terminal of the outer windings 102 and 202. Inner windings 101 or 201 may each feature two or more voltage terminals 208A and 208B, with a first one of the voltage terminals electrically connected to the inner semiconducting layer 105. One of two or more voltage terminals 208A or 208B may set the voltage of the inner semiconducting layer 105 to the same electrical voltage as the first voltage terminal of the inner windings 101 or 201.

Each of windings 101, 102, 201 and 202 may feature two or more terminals for connecting to voltage terminals external to the transformer 101. The terminals are electrically connected to the ends of each winding and are configured to connect to a circuit that utilizes the transformer, such as a load circuit connected to the outer windings 102 or 202 and a power source circuit connected to the inner windings 101 or 201. For example, each set of windings 101, 102, 201 and 202 may each have two voltage terminals, one at each end of the winding. The voltage terminals may be connected to a varying voltage having an amplitude (such as an alternating current [AC] voltage having an amplitude of several volts, tens of volts, hundreds of volts, thousands, or tens of thousands of volts). Windings 101, 102, 201 and 202 may be magnetically coupled to one another respectively via core 106, and may also be magnetically coupled to other windings (such as additional secondary windings).

Semiconducting layers 104 and 105 may be formed using semiconducting material. For example, semiconducting material 104 and 105 may be semiconducting plastic, isolating plastic with a semiconducting coating, or other semiconducting materials. Semiconducting layers 104 and 105 may be electrically connected to one another to form a combined semiconducting layer 104 and 105 over both legs of core 106. The semiconducting layers 104 and 105 may be manufactured (such as by being cast) from a single component, or may be formed combining separately-manufactured components. For example, a single mold may be used for manufacturing several semiconducting layers 104 and 105. The semiconducting layers 104 and 105 may be shaped, at least in part, to form Rogowski profiles or other profiles, which may increase uniformity in an electrical field created between components at two voltages.

Inner windings 101 and 201 may be electrically connected (such as by direct electrical connection) to a first electrical voltage. Outer windings 102 and 202 may be electrically connected (such as by direct electrical connection) to a second electrical voltage (that may be different from the first electrical voltage). For example, inner windings 101 and 201 may have a voltage near a ground voltage, and outer windings 102 and 202 may have a voltage that is about 100V, 1000V, 10 kV, 20 kV, 50 kV, 69 kV, or an even higher voltage. Inner windings 101 and 201 may be electrically connected to a varying voltage. For example, inner windings 101 and 201 may be electrically connected to a voltage varying (such as, sinusoidally or as a square-wave) between, for example, about −1 kV and +1 kV, −10 kV and +10 kV, −20 kV and +20 kV, −69 and +69 kV. Inner windings 101 and 201 may be electrically connected to a varying voltage having an amplitude up to 69 kV. Aspects disclosed herein may be modified to reduce electrical field stress in high voltage transformers such as transformers configured to reach voltages of up to about 1 megavolt.

A voltage drop may exist between sets of windings (e.g., as a result of the different windings being electrically connected to different voltage levels). As discussed regarding the numerical examples above, the voltage drop may be relatively large—for example, tens, hundreds or thousands of kilovolts. Electrically connecting outer windings 102 and 202 to the outer semiconducting layer 104, and electrically connecting inner windings 101 and 201 to the inner semiconducting layer 105, may cause the voltage drop to exist between the inner semiconducting layer 105 and the outer semiconducting layer 104. The inner semiconducting layer 105 may encompass at least in part the inner windings 101 and 201 and the outer semiconducting layer 104 may encompass at least in part the inner semiconducting layer 105. This arrangement may have the advantage of shielding the outer windings 102 and 202, the inner windings 101 and 201, and the semiconducting layers 104 and 105 from one another. This shielding may reduce the insulation around the wires used for the windings to a rating that may be far less than the voltage difference between outer windings 102 and 202 and inner windings 101 and 201. For example, outer windings 102 and 202 may have a voltage drop of up to about 1000V between two terminals on outer windings 102 and 202. Similarly, inner windings 101 and 201 may have a voltage drop of up to about 1000V between two terminals on inner windings 101 and 201. Outer windings 102 and 202 may be electrically connected to about 20 kV, and inner windings may be electrically connected to a ground voltage (e.g., about 0V).

Insulating material layers 107 and 207 may be the same as the material used for manufacturing a transformer case, and may be injected during the formation of the transformer 110. The injection may be, for example, vacuum potting, automatic pressure gelation, or other suitable methods of injection.

Figure 4:
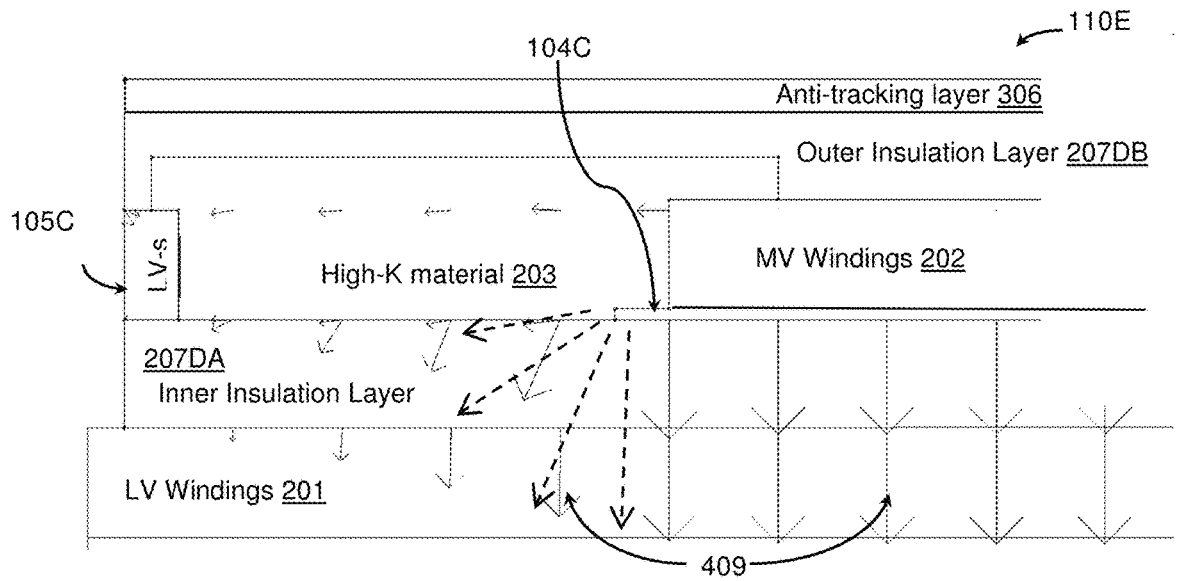
FIG. 4 shows an example simulation of a transformer in accordance with the disclosure herein.

Reference is now made to FIG. 4, which shows an example simulation of a transformer 110E (such as the model transformer 110D of FIG. 3) in accordance with the disclosure herein, according to a profile view, and including electric field indications 409. The example simulation was computed based on a 0 V voltage on the LV windings 201, a 30 kV voltage on the MV windings 202, and stress control regions 203 with a relative permittivity of 25. Solid arrows indicate electrical field directions, with the size of the arrows indicating magnitudes. Short arrows indicate a relatively weak field, and longer arrows a relatively stronger field. The simulation indicates how the electrical field is reduced in the region between the MV windings 202 and LV windings 201. Dashed arrows indicate the field direction and strength in the absence of a stress control region 203, where the longer dashed arrows indicate a stronger field strength. As in FIG. 3, FIG. 4 shows other elements of the transformer 110E: inner insulation layer 207DA, LV semiconducting layer 105C, MV semiconducting layer 104C, outer insulation layer 207DB, and anti-tracking layer 306.

Although examples are described above, features and/or steps of those examples may be combined, divided, omitted, rearranged, revised, and/or augmented in any desired manner. Various alterations, modifications, and improvements will readily occur to those skilled in the art. For example, legs of core 106 may have round or oval cross-sections, rather than a rectangular cross-section; and outer semiconducting layer legs may have round or rectangular cross sections instead of an oval cross-section. As another example, core 106 may include more legs (e.g., a third leg or more), and each leg may feature more than two sets of windings and/or more than two semiconducting layers. Such alterations, modifications, and improvements are intended to be part of this description, though not expressly stated herein, and are intended to be within the spirit and scope of the disclosure. Accordingly, the foregoing description is by way of example only, and is not limiting.

What is claimed is:
1. An apparatus comprising:
a magnetic core comprising a core leg;
inner windings disposed around the core leg;
outer windings disposed around the inner windings, wherein the outer windings comprise outer winding edges;
an insulation layer between the inner windings and the outer windings, wherein the insulation layer extends beyond the outer winding edges and shields the outer windings from the inner windings;
an inner semiconducting layer between the inner windings and the insulation layer;
an outer semiconducting layer between the insulation layer and the outer windings, wherein the outer semiconducting layer comprises outer semiconducting layer edges aligned with the outer winding edges; and
stress control material different from an insulating material of the insulation layer, wherein the stress control material is disposed adjacent to the outer winding edges and adjacent to the insulating material of the insulation layer, wherein the stress control material comprises a material with a relative permittivity greater than or equal to ten.

2. The apparatus of claim 1, wherein the apparatus is a transformer.

3. The apparatus of claim 1, wherein the stress control material comprises a non-linear resistive material.

4. The apparatus of claim 1, wherein the stress control material comprises a capacitive material.

5. The apparatus of claim 1, wherein the inner windings comprise a plurality of inner voltage terminals, and wherein a first voltage terminal of the plurality of inner voltage terminals is electrically connected to the inner semiconducting layer.

6. The apparatus of claim 1, wherein the stress control material comprises a composite material comprising a matrix and filler, and wherein the filler comprises a capacitive material.

7. The apparatus of claim 1, wherein the stress control material comprises a composite material comprising a matrix and filler, and wherein the filler comprises a non-linear resistive material.

8. The apparatus of claim 1, wherein the outer windings comprise a plurality of outer voltage terminals, and wherein an outer voltage terminal of the plurality of outer voltage terminals is electrically connected to the outer semiconducting layer.

9. The apparatus of claim 1, wherein the stress control material comprises a composite material comprising a matrix and filler, and wherein the filler has a relative permittivity greater than or equal to ten.

10. The apparatus of claim 1,
wherein an inner voltage terminal is electrically connected to the inner semiconducting layer,
wherein an outer voltage terminal is electrically connected to the outer semiconducting layer,
wherein the inner voltage terminal is configured to operate at a first voltage, and
wherein the outer voltage terminal is configured to operate at a second voltage.

11. The apparatus of claim 10, wherein, when the apparatus is operational, the first voltage is less than the second voltage by more than 100 volts.

12. The apparatus of claim 10, wherein, when the apparatus is operational, the first voltage is less than the second voltage, and the first voltage and the second voltage comprise an alternating voltages.

13. The apparatus of claim 10, wherein, when the apparatus is operational, a voltage difference between the first voltage and the second voltage varies according to an alternating voltage having an amplitude up to 69,000 volts.

14. The apparatus of claim 10, wherein, when the apparatus is operational, the first voltage is an electrical ground potential.

15. The apparatus of claim 10, wherein, when the apparatus is operational, the second voltage is greater than 5,000 volts.

16. A power device comprising:
a magnetic core comprising a core leg;
inner windings disposed around the core leg;
outer windings disposed around the inner windings, wherein the outer windings comprise outer winding edges;
an insulation layer between the inner windings and the outer windings, wherein the insulation layer extends beyond the outer winding edges and shields the outer windings from the inner windings;
an inner semiconducting layer between the inner windings and the insulation layer;
an outer semiconducting layer between the insulation layer and the outer windings, wherein the outer semiconducting layer comprises outer semiconducting layer edges aligned with the outer winding edges; and
stress control material different from an insulating material of the insulation layer, wherein the stress control material is disposed adjacent to the outer winding edges and adjacent to the insulating material of the insulation layer, wherein the stress control material comprises a material with a relative permittivity greater than or equal to ten.

17. The power device of claim 16, wherein the power device is a transformer.

18. A system comprising:
a magnetic core comprising a core leg;
inner windings disposed around the core leg;
outer windings disposed around the inner windings, wherein the outer windings comprise outer winding edges;
an insulation layer between the inner windings and the outer windings, wherein the insulation layer extends beyond the outer winding edges and shields the outer windings from the inner windings;
an inner semiconducting layer between the inner windings and the insulation layer;
an outer semiconducting layer between the insulation layer and the outer windings, wherein the outer semiconducting layer comprises outer semiconducting layer edges aligned with the outer winding edges;
stress control material different from an insulating material of the insulation layer, wherein the stress control material is disposed adjacent to the outer winding edges and adjacent to the insulating material of the insulation layer, wherein the stress control material comprises a material with a relative permittivity greater than or equal to ten;
a power source circuit connected to the inner windings; and
a load circuit connected to the outer windings.

19. The system of claim 18,
wherein an inner voltage terminal is electrically connected to the inner semiconducting layer,
wherein an outer voltage terminal is electrically connected to the outer semiconducting layer,
wherein the inner voltage terminal is configured to operate at a first voltage, and
wherein the outer voltage terminal is configured to operate at a second voltage
wherein, when the system is operational, the first voltage is less than the second voltage by more than 100 volts.

20. A method comprising:
providing a magnetic core comprising a core leg;
disposing inner windings around the core leg;
disposing outer windings around the inner windings, wherein the outer windings comprise outer winding edges;
disposing an insulation layer between the inner windings and the outer windings, wherein the insulation layer extends beyond the outer winding edges and shields the outer windings from the inner windings;
disposing an inner semiconducting layer between the inner windings and the insulation layer;
disposing an outer semiconducting layer between the insulation layer and the outer windings, wherein the outer semiconducting layer comprises outer semiconducting layer edges aligned with the outer winding edges; and
disposing stress control material, different from an insulating material of the insulation layer, adjacent to the outer winding edges and adjacent to the insulating material of the insulation layer, wherein the stress control material comprises a material with a relative permittivity greater than or equal to ten.

* * * * *